United States Patent [19]

Jones

[11] 4,339,305

[45] Jul. 13, 1982

[54] PLANAR CIRCUIT FABRICATION BY PLATING AND LIFTOFF

[75] Inventor: Addison B. Jones, Yorba Linda, Calif.

[73] Assignee: Rockwell International Corporation, El Segundo, Calif.

[21] Appl. No.: 231,712

[22] Filed: Feb. 5, 1981

[51] Int. Cl.³ .............. B44C 1/22; C03C 15/00; C03C 25/06; B29C 17/08

[52] U.S. Cl. .............. 156/650; 29/580; 156/655; 156/657; 156/659.1; 156/668; 357/71; 365/37; 365/39; 427/89; 427/91; 427/92; 427/131; 430/313; 430/317; 204/192 C

[58] Field of Search .............. 29/580, 590, 591; 357/67, 68, 71; 427/89-91, 92, 127-132; 430/313, 314, 315, 316, 317, 329; 156/651, 653, 657, 659.1, 662, 655, 654, 650, 668; 365/1, 29, 37, 39; 204/192 C, 192 EC

[56] References Cited

U.S. PATENT DOCUMENTS 3,567,508 3/1971 Cox et al. .............. 427/90
3,985,597 10/1976 Zielinski .............. 427/90 X
4,076,575 2/1978 Chang .............. 156/659.1 X
4,251,319 2/1981 Bonnie et al. .............. 156/656

OTHER PUBLICATIONS

IBM Technical Disclosure Bulletin, vol. 18, No. 11, Apr. 1976, Producing Contacts For Integrated Semiconductor Devices by A. Bohg et al. pp. 3734-3735.
IBM Technical Disclosure Bulletin, vol. 17, No. 2, Jul. 1974, Lift-Off Method of Fabricating Thin Films by L. R. Weaver, pp. 351-352.

Primary Examiner—William A. Powell
Attorney, Agent, or Firm—H. Fredrick Hamann; James F. Kirk

[57] ABSTRACT

The method of manufacturing predetermined microcircuit conductor patterns, which includes forming on the surface plane of a substrate a layer of insulator material, forming a layer of resist on the layer of insulator material, patterning the layer of resist to define a channel pattern, etching the channel pattern with relatively overwide channels, conditioning the channel bases to receive plating material, and thereafter filling the overwide channels with the plating material to a height at least substantially co-planar with the insulator material to define the predetermined conductor patterns, removing the mask and plated material thereon to uncover completely the conductor pattern.

24 Claims, 6 Drawing Figures

PLANAR CIRCUIT FABRICATION BY PLATING AND LIFTOFF

BACKGROUND OF THE INVENTION

1. Field of the Invention

This invention relates to a method of fabricating microcircuit devices commonly used in home and office computers, and more particularly, has to do with a method for producing multiple level conductor material patterns in co-parallel or stacked parallel planes, embedded in insulator material, and having a constant and uniform separation between pattern levels in a manner highly advantageous for bubble memory circuit devices.

2. Description of the Prior Art

Microelectronic devices such as hybrid circuits, silicon integrated circuits, and magnetic bubble domain circuits are known in the art. These devices typically comprise components mounted on or fabricated in a substrate which is processed to provide the required circuit conductor interconnections for single-layer or multi-layer conductor patterns. Conductor patterns are typically made of aluminum copper alloy or gold. In bubble domain circuits, layers of different conductor materials such as a first level layer of aluminum copper alloy and a second layer of permalloy (nickel iron alloy) are formed on a suitable substrate, such as garnet.

Conventional bubble domain circuit devices have multi-layer, multi-level conductor patterns spaced by an insulator layer covering the first level of conductor material pattern, atop the substrate of garnet. Because of the way these devices have previously been manufactured, the insulator layer varies in its spacing from the garnet substrate depending on whether the insulator area is over or between portions of the conductor material pattern. The next conductor pattern level, e.g. nickel iron alloy is applied to the insulator layer to form the bubble memory device. Variations in insulator layer spacing relative to the garnet thus are carried over to the nickel iron alloy second level pattern, and nonuniform spacing results between regions of the nickel iron alloy second level pattern and the garnet substrate.

Nonuniform spacing between the nickel iron alloy or other second level pattern and a garnet substrate, adversely affects bubble memory device performance. And, as bubble domains are scaled down in size to 2 μm or even smaller, poor device performance traceable to spacing disuniformities becomes particularly significant and will result in reduced yield of good devices in production.

In addition to these problems, layers of conductor or insulator material that contour or cross-over are subject to cracking, thinning, narrowing, and developing discontinuities at corners of the contour transition.

A further problem of significance in manufacturing multi-layer, multi-level conductor patterns is that the presence of appreciable contour in resist patterns makes difficult the obtaining of clear and distinct photo exposures, which in turn limits the obtainable minimum in line widths, the number of interconnections per unit area, and the maximum number of layers that can be achieved.

Among publications in the field is U.S. Pat. No. 3,985,597 to L. Zielinski, issued Oct. 12, 1976, which discloses a method for forming conductors embedded in dielectric to form a planar surface. See also the process disclosed in IBM Technical Disclosure Bulletin, Vol. 17, No. 12, July 1974, at page 352, copies of which are being furnished with this application.

SUMMARY OF THE INVENTION

It is, therefore, a major objective of this invention to provide a method of manufacturing multi-layer, multi-level conductor pattern devices for bubble domain circuits, and like purposes in which the several layers are uniformly spaced and in stacked parallel planar relation with themselves and with the substrate.

It is a further object of this invention to minimize a variation in spacing between the substrate and that of the planar conductor patterns thereon in semiconductor devices.

It is a particular object of this invention to provide uniform spacing between the first and second level planar conductor patterns in such devices.

It is a highly particular object of this invention to provide a method of manufacturing bubble domain structures having first and second level conductor patterns in stacked parallel planar relation embedded in dielectric on a substrate of garnet; and void-free structures produced by the method.

It is a highly particular object of this invention to provide a method of manufacturing conductor patterns of uniform conductor thickness, free of cracks, thinning, narrowing, and discontinuities at the corners of the contour or cross-over areas in stacked parallel planar relation and in bubble domain structure defining relation in void-free dielectric on a substrate of garnet.

It is a most highly particular objective of this invention to produce planar conductor patterns upon which subsequent patterns may be subjected to clear and distinct exposure, free of the distortion and imperfection common to non-planar multi-level near micromilimeter line width exposures at line cross-over points.

These and other objectives of the invention are realized in accordance with the invention in a method of manufacturing predetermined microcircuit conductor patterns, which includes forming on the surface plane of a substrate a layer of insulator material, forming a layer of resist on the layer of insulator material, patterning the layer of resist to define a channel pattern, etching the channel pattern to form a pattern of relatively overwide channels; conditioning the channel bases to receive plating material and then filling the relatively overwide channels with plating material to a height at least substantially co-planar with said layer of insulating material. The mask is then removed with the vacuum deposited thin second layer of material and the plated material thereon, exposing the pattern of relatively overwide channels with plating therein.

In a preferred embodiment, the invention provides a method wherein multiple interconnection conductor levels are formed in stacked parallel plane relation to the substrate by repeating the sequence of process steps.

In preferred embodiments of the invention, the material of the substrate is garnet, and the material of the layer of insulator material on the substrate is $SiO_2$ deposited by sputtering. In yet another preferred embodiment the layer of insulator material on the substrate is an insulative organic polymer film.

In a preferred embodiment of the invention, the channel base is conditioned to receive plating material by depositing a conditioning material such as a metal selected from copper, nickel or platinum on the channel base by vacuum evaporation or sputtering.

In a particularly preferred embodiment of the invention, filled electroless plating is used to fill the relatively overwide channels with a suitable conductor such as gold.

In a more particularly preferred embodiment, the layer of insulator material on the substrate is deposited to a thickness of 2000 to 8000 angstroms.

In certain embodiments of the invention, the layer of conditioning material that is adapted to attach electroless plating materials is deposited to a thickness of from 100 to 1000 angstroms.

In each of the foregoing, and other embodiments of the invention, the planar circuit fabrication method provides, a method of manufacturing microcircuit devices by locally depositing conductor material in a predetermined pattern on a substrate following etching of channels in the substrate through a resist layer defining the pattern, the etching tending to undercut the pattern defining edges of the resist layer whereby subsequently applied conductor material does not fill the channel and non-planarity results in the device, the improvements comprising: depositing a platable material in the bottom or base of the channels in a resist layer etch-determined pattern, and thereafter plating a channel filling amount of conductor material onto the platable material in resist layer etch-dependent relation to provide conductor material substrate planarity in the device at the resist-substrate interface.

BRIEF DESCRIPTION OF THE DRAWINGS

The invention will be further described as to an illustrative embodiment thereof in conjunction with the attached drawings in which.

DESCRIPTION OF THE PREFERRED EMBODIMENT

Figure 1:
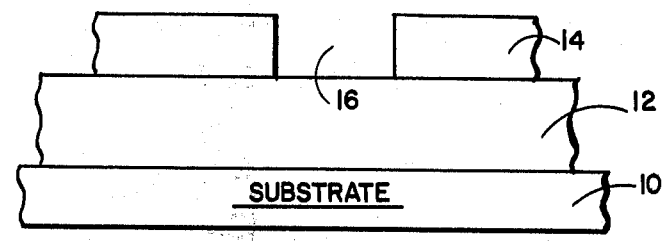
FIGS. 1 through 5 are cross-sectional views illustrating the various steps of the method of the present invention.

Referring now to FIG. 1 through 5 there is shown and described a method of manufacturing microcircuit conductor patterns. FIG. 1 shows substrate 10 on which is deposited a layer of insulator material 12. A layer of resist 14 is shown deposited on the first layer of insulator material 12. The resist material 14 is patterned to form a first channel defining pattern 16.

Photoresist material 14 is of any suitable material such as Shipley's type AZ 1350 J. The material is typically applied to a thickness of one micrometer by spin-casting or dipping. The photoresist material to be removed, shown in region 16 of FIG. 1 is first exposed using a suitable pattern mask, ultraviolet, X-rays, electron or ion beams, or other known techniques, and is then developed to permit subsequent etching.

Figure 2:
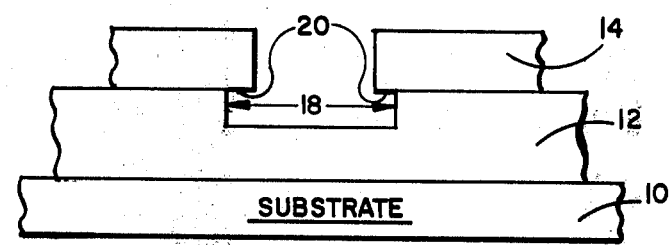

FIG. 2 illustrates the results of etching the first channel defining pattern in the insulator material 12 to form channel 18 in a manner providing areas of over-etch 20. Etching may be accomplished using wet chemical, plasma, or reactive ion techniques to produce the slight over-etch effect. Over-etch areas 20 makes the channel 18 overwide, i.e. the channel is wider than the pattern 16 on insulator material 12.

Figure 3:
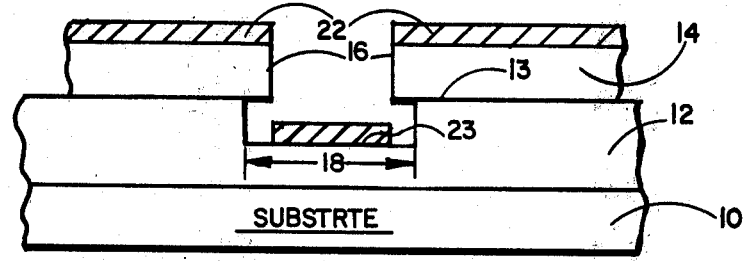

FIG. 3 shows a thin layer 22 of conditioning material such as copper, nickel, platinum, or other material adapted to electroless plating applied to the bottom, or base 23 of the channel 18, as shown. This layer is applied by vacuum deposition methods including vacuum evaporation and sputtering methods. Vacuum evaporation is performed by heating the material to be deposited in a vacuum using an electron beam or a refractory filament. The target material is heated to a temperature sufficiently high to cause the target material to boil and vaporize and thereafter deposit on the much colder substrate. Sputtering is achieved in a similar chamber having a lower vacuum into which a gas is introduced such as argon. The target material is charged to a negative potential and the surface to be plated is charged to a positive potential. The potential difference used is selected to be sufficient to ionize the gas to form a plasma which then bombards the target material causing it to ionize and travel through the plasma to the surface to be plated. The deposition method selected thereby coats the entire resist 14, covered substrate 10 surface and the base 23 of the pattern of relatively overwide channels 18. The coated photoresist 14 is left in place to avoid local variations in plating rate caused by variations in size of areas to be plated and related local fluctuations in bath concentrations. The conductor pattern is now defined by plating a conductor into relatively overwide channels 18.

Figure 4:
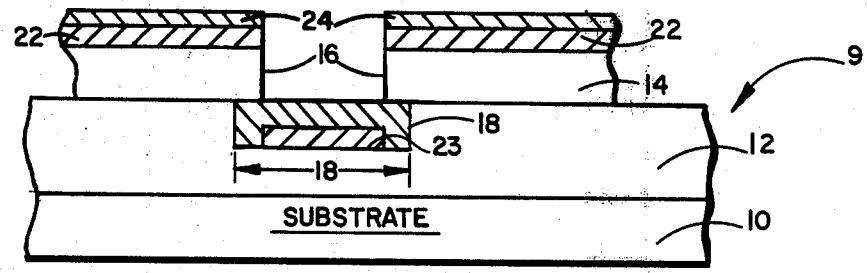

FIG. 4 shows the result of filling the overwide channels 18 with a conductive plating material to a height at least substantially co-planar with the first layer 12 of insulator material using electroless plated metal 24 such as gold, plated onto the conditioning material 22, forming plated wafer 9. Gold is typically plated by dipping the wafer 9 into a pre-plating bath such as LECTROLESS PREP by Sel-Rex of Nutley, New Jersey, a mixture of gold and metallic salts. This step conditions the surface and applies a thin flash gold coating to wafer 9. To complete the electroless plating step, wafer 9 is then placed in a second solution such as LECTROLESS AU, also by Sel-Rex for a predetermined time. The LECTROLESS AU solution contains a higher concentration of platable gold. Wafer 9 is then removed from the bath and cleaned.

Figure 5:
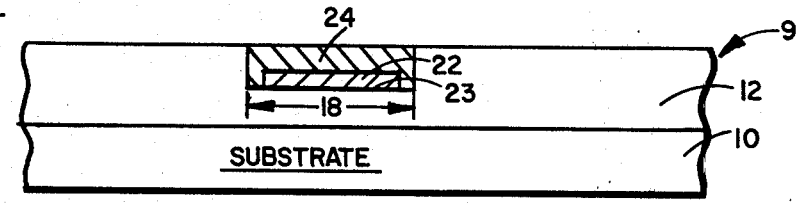

The resist 14 is then lifted off. This is typically accomplished by soaking the plated wafer 9 in warm acetone for a short time (e.g. 10 to 15 minutes). This soak is usually sufficient to swell and dissolve photoresist layer 14 such that it and any materials deposited thereon such as excess plating 24, if any are removed exposing the pattern of relatively overwide channels with electroless plating 24 therein. FIG. 5 shows the device from FIG. 4 after the lift-off process.

Figure 6:
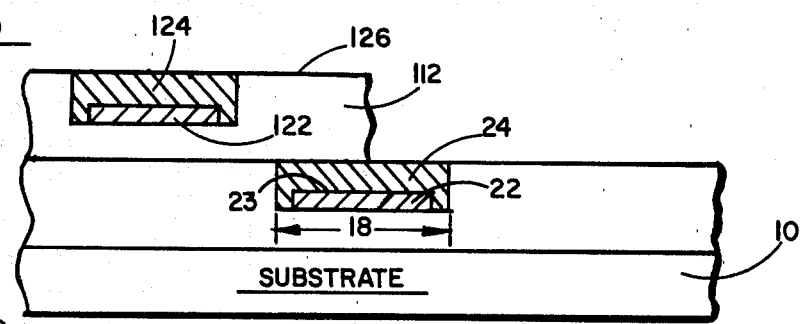
FIG. 6 is a cross-sectional view of a microcircuit having planar two-level conductor patterns in stacked parallel plane relation to a substrate, and a planar surface according to the invention.

FIG. 6 illustrates the result of repeating the foregoing steps e.g. by depositing an additional layer 112 of insulator material on the first layer 12 of insulator material, the pattern of relatively overwide channels 18 already having electroless plating 24 therein. The additional insulator material 112 defines a planar surface 126 uniformly spaced above the substrate 10. By repeating the sequence of steps illustrated in FIG.1 through FIG. 5, an additional pattern of relatively overwide channels 118 with electroless plating 124 therein as formed on additional vacuum deposited thin layers 122 of electroless plating conditioning material to the additional layers of resist material 114 and to the base 123 of the additional patterns of overwide channels. By further repeating the steps of FIG. 1 through FIG. 5, multiple interconnection conductor levels are formed, as shown in FIG. 6, in stacked parallel plane relation to the substrate 10.

The material of the substrate 10 in a bubble memory structure is typically garnet; however, the present method also envisions the use of alumina, sapphire, beryllium oxide (BeO), and organic coatings. The material of the first layer 12 of insulator material is typically, $SiO_2$ deposited by using sputtering or using a standard E-beam vacuum deposition method as described hereinabove over the entire substrate surface. The method also envisions the use of polymer film coatings for the first layer. The first layer 12 is typically deposited to a thickness of 2000 to 8000 angstroms. The vacuum deposited thin layer of material 22 is typically deposited to a thickness of from 100 to 1000 angstroms.

The electroless plating material, e.g. gold, will not deposit on the first insulator layer 12 or the uncoated portions of the resist material 14, thereby avoiding bridging the channel 18 prior to filling the channel, preventing occurrence of channel voids, and irregularities, and thereby permitting relatively fine line conductor channel plating.

Conductor pattern designs which permit electrical contact with all segments of the base material 22 allows the user to substitute electrolytic plating methods and materials for electroless plating materials.

Where the topmost surface 126 of the device need not be planar, but the conductor patterns are required to be in stacked parallel plane relation with predetermined uniform spaced relation to the substrate, and to the other conductor plane, e.g. as in bubble memory devices, the additional insulator material 112 is typically formed with a 500 angstrom thick layer of $SiO_2$, followed by a 3000 angstrom thick patterned and etched layer of nickel iron alloy.

There is thus provided a method of producing multiple-level conductor material patterns having the advantage of co-parallel or stacked parallel conductor planes, embedded in insulator material, and having constant and uniform separation between pattern levels. The embodiment provided includes many specific dimensions and materials. However, the description is intended to be illustrative only and is not intended to be limitative. Those skilled in the art may conceive of modifications to the specific materials and parameters which are described. However, any such modifications which fall within the purview of the description are intended to be included therein as well. The scope of this invention instead shall be determined from the scope of the following claims including their equivalents.

What is claimed is:

1. The method of manufacturing predetermined microcircuit conductor patterns, which includes:
   (a) forming on the surface of a plane substrate a layer of insulator material,
   (b) forming a layer of resist on said layer of insulator material,
   (c) patterning said layer of resist to define a channel pattern,
   (d) etching said channel pattern into said insulator material layer
      (dd) with relatively overwide channel to provide channel bases spaced from and free of communication with said substrate,
   (e) conditioning the channel bases to receive plating material, and thereafter
   (f) filling said overwide channels with said plating material on said conditioned bases spaced from the substrate and extending to a height at least substantially co-planar with said insulator material to define said predetermined conductor patterns,
   (g) removing said mask and plated material thereon to uncover completely said conductor.

2. The method of claim 1 including also repeating the sequence of process steps to form multiple interconnection conductor levels in stacked parallel plane relation to the substrate.

3. The method of claim 1, including also providing garnet as the material of said substrate.

4. The method of claim 3, including also forming said layer of insulator material of $SiO_2$.

5. The method of claim 4, including also depositing said layer of insulator material onto said substrate to a thickness of 2000 to 8000 angstroms.

6. The method of claim 3, including also depositing insulative organic polymer film on said substrate to form said layer of insulator material.

7. The method of claim 1, wherein metal is deposited on the channel bases to effect said conditioning.

8. The method of claim 6, including also depositing said layer of conditioning material onto the base of the relatively overwide channels to a thickness of 100 to 1000 angstroms.

9. The method of claim 7, including also selecting the metal for conditioning said channel base from copper, nickel and platinum.

10. The method of claim 9, including also applying the metal for conditioning said channel base by evaporation.

11. The method of claim 9, including also applying the metal for conditioning said channel base by sputtering.

12. The method of claim 9, including also electrolessly depositing said plating material in said channels on said conditioned channel base to fill said relatively overwide channels.

13. The method of claim 12, including also forming said layer of insulator material of $SiO_2$.

14. The method of claim 13, including also depositing said layer of insulator material onto said substrate to a thickness of 2000 to 8000 angstroms.

15. The method of claim 14, including also applying the metal for conditioning said channel base by evaporation.

16. The method of claim 15, including also applying the metal for conditioning said channel base by sputtering.

17. The method of claim 16, including also providing garnet as the material of said substrate.

18. The method of claim 17, including also plating gold as said plating material.

19. The method of claim 18, including also repeating the sequence of process steps to form multiple interconnection levels in stacked parallel plane relation to the substrate.

20. The method of claim 12, including also repeating the sequence of process steps to form multiple interconnection conductor levels in stacked parallel plane relation to the substrate.

21. In the method of manufacturing microcircuit devices by locally depositing conductor material in a predetermined pattern on a substrate following etching of channels in the substrate through a resist layer defining said pattern, said etching tending to undercut the pattern defining edges of the resist layer whereby subsequently applied conductor material does not fill the channel and non-planarity results in the device, the improvement comprising: etching said channel pattern in said insulator material layer with overwide channels to provide channel bases spaced from and free of communication with said substrate, conditioning the channel bases by depositing a platable material in the bottom of said channels in a resist layer etch-determined pattern, and thereafter plating a channel filling amount of conductor material onto said platable material in resist layer etch-dependent relation to provide conductor material substrate planarity in the device at the resist-substrate interface.

22. The method of claim 1 wherein: the conditioning step applies metal to the resist and channel bases to leave exposed base portions under the overwide portions of the channels.

23. The method of claim 22, wherein: said conditioning step partially covers said channel bases with metal, the remainder of said channel bases being covered by said subsequent filling step.

24. The method of claim 1 wherein:
the conditioning step applies metal laid down on a portion of said base vertically through said channel.

* * * * *

UNITED STATES PATENT AND TRADEMARK OFFICE
CERTIFICATE OF CORRECTION

PATENT NO. : 4,339,305
DATED : July 13, 1982
INVENTOR(S) : Addison B. Jones

It is certified that error appears in the above-identified patent and that said Letters Patent are hereby corrected as shown below:

Column 6, line 58, before the word "levels" add -- conductor --.

Signed and Sealed this

Twenth-eighth Day of September 1982

[SEAL]

Attest:

GERALD J. MOSSINGHOFF

Attesting Officer     Commissioner of Patents and Trademarks